United States Patent
Lim et al.

(10) Patent No.: US 7,558,073 B2
(45) Date of Patent: Jul. 7, 2009

(54) MULTIFUNCTIONAL PERIPHERAL DEVICE

(75) Inventors: Jeong-pil Lim, Seongnam-si (KR); In-gu Kwak, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 289 days.

(21) Appl. No.: 10/952,715

(22) Filed: Sep. 30, 2004

(65) Prior Publication Data

US 2005/0073820 A1    Apr. 7, 2005

(30) Foreign Application Priority Data

Oct. 2, 2003    (KR)    ............ 10-2003-0068661

(51) Int. Cl.
*H05K 7/14*    (2006.01)
(52) U.S. Cl. ............ 361/796; 361/784; 361/792; 361/752; 361/721; 361/748; 361/749
(58) Field of Classification Search ............ 361/721, 361/752, 788, 784, 792, 796, 748, 749
See application file for complete search history.

(56) References Cited

U.S. PATENT DOCUMENTS

| | | | | |
|---|---|---|---|---|
| 5,561,499 A | * | 10/1996 | Setoriyama | ............ 399/111 |
| 5,796,594 A | * | 8/1998 | Kabat et al. | ............ 361/818 |
| 6,342,955 B1 | * | 1/2002 | Matsumoto | ............ 358/471 |
| 6,487,087 B1 | * | 11/2002 | Langley | ............ 361/784 |
| 6,532,157 B1 | * | 3/2003 | Glenn et al. | ............ 361/767 |
| 6,535,706 B1 | | 3/2003 | Konno | |
| 6,952,352 B2 | * | 10/2005 | Emma et al. | ............ 361/767 |
| 6,975,814 B2 | * | 12/2005 | Tsusaka et al. | ............ 399/6 |
| 7,012,812 B2 | * | 3/2006 | Haba | ............ 361/792 |
| 7,154,761 B1 | * | 12/2006 | Camerlo et al. | ............ 361/788 |
| 2004/0100782 A1 | * | 5/2004 | Bozso et al. | ............ 361/796 |
| 2005/0162840 A1 | * | 7/2005 | Morita | ............ 361/784 |
| 2006/0067066 A1 | * | 3/2006 | Meier et al. | ............ 361/785 |

FOREIGN PATENT DOCUMENTS

| | | |
|---|---|---|
| JP | 6-3877 | 1/1994 |
| JP | 10-309844 | 11/1998 |
| JP | 11-146100 | 5/1999 |
| JP | 2001-309095 | 11/2001 |

* cited by examiner

*Primary Examiner*—Dean A. Reichard
*Assistant Examiner*—Hoa C Nguyen
(74) *Attorney, Agent, or Firm*—Staas & Halsey LLP

(57) ABSTRACT

A multifunctional apparatus includes a first circuit board which is installed on a low surface of a main body, receives a current from an external power source and supplies the current to other circuit boards and devices; a second circuit board which is installed on a surface of the main body and includes a controller to control the other circuit boards and devices; and a third circuit board which is installed on an upper surface of the main body and supplies the current or transfers control signals to a scanning unit.

4 Claims, 3 Drawing Sheets

MULTIFUNCTIONAL PERIPHERAL DEVICE

CROSS-REFERENCE TO RELATED APPLICATIONS

This application claims the priority of Korean Patent Application No. 2003-68661, filed on Oct. 2, 2003, in the Korean Intellectual Property Office, the disclosure of which is incorporated herein by reference.

BACKGROUND OF THE INVENTION

1. Field of the Invention

The present invention relates to a multifunctional apparatus, and more particularly, to a multifunctional apparatus having a reduced number of circuit boards to lower electromagnetic interference (EMI), the circuit boards being connected to one another by connecting units of a short length.

2. Description of the Related Art

A multifunctional apparatus is a single apparatus in which several office automation (OA) devices such as a printer, a scanner, and a facsimile machine are combined. The multifunctional apparatus generally includes a printing unit and a scanning unit. The multifunctional apparatus simultaneously reads document data and prints the data on other papers. The scanning unit is located in an upper portion of the apparatus to be easily opened and closed. Accordingly, in order to supply power and transfer control signals to the scanning unit, a connecting unit is needed to connect a power board, which receives current from an external power source and distributes the current to a circuit board and other devices, and a main board in which a controller to control the circuit board and other devices is mounted.

FIG. 1 is a perspective view schematically illustrating an example of a conventional multifunctional apparatus. FIG. 2 is a perspective view of a layout of a circuit board in the multifunctional apparatus of FIG. 1.

Referring to FIG. 1, a multifunctional apparatus 10 includes a cassette 11 into which paper is loaded and which is attachable to and detachable from a main body, a printing holder 12 into which papers are discharged after printing, a control panel 13 having installed therein control buttons to control the multifunctional apparatus 10, a scanning unit cover 14 which is installed to rotate and move up and down from the main body, a paper supplier 15, onto which documents to be scanned are placed, and a scanning holder 16 into which the scanned papers are discharged after scanning.

If the scanning unit cover 14 moves upwards, a scanning plane (not shown) covered by the scanning unit cover 14 is exposed. A scanning module (not shown), capable of sliding and projecting lights to scan the papers, is installed below in a lower surface of the scanning plane.

Referring to FIG. 2, a power board 21 which receives current from an external power source and distributes the current to other circuit boards and devices, and a main board 22, in which a controller to control other circuit boards and devices is installed, are disposed parallel to a lower surface 34 of the multifunctional apparatus 10.

A scanning unit board 24, which supplies current to a scanning unit (not shown) and which reduces signals to control the scanning unit, is installed on an upper surface 32 of the multifunctional apparatus 10. In addition, a connecting board 23 to connect the main board 22 and the scanning unit board 24 is disposed on a surface 33 of the multifunctional apparatus 10.

The power board 21, the main board 22, the connecting board 23, and the scanning unit board 24 are connected to each other. That is, the power board 21 and the main board 22 are connected by a first connecting unit 25, the main board 22 and the connecting board 23 are connected by a second connecting unit 26, and the connecting board 23 and the scanning unit board 24 are connected by a third connecting unit 27.

As shown in FIG. 2, the second connecting unit 26 and the third connecting unit 27 are perpendicular to each other. The connecting board 23 may be regarded as a connecting unit to connect the second connecting unit 26 and the third connecting unit 27 which connect the main board 22 and the scanning unit board 24.

In this case, a connecting distance between the main board 22 and the scanning unit board 24 is long, and thus, it is effective that some functions of the main board 22, related to the scanning unit board 24, be transferred to an extra board which is placed near the scanning unit board 24. Therefore, the connecting board 23 is additionally formed and a length of the second and third connecting units 26 and 27 becomes long.

As such, the quality of signals through the connecting units 26 and 27 is lowered and the electromagnetic interference (EMI) therebetween becomes worse. Given that an antenna operates most efficiently when the length of the antenna is equal to one fourth of a wavelength, the second connecting unit 26, the third connecting unit 27, and the connecting board 23 act as a good antenna at a frequency below 300 MHz, and electromagnetic energy radiates via the connecting units 26, 27 to circuit boards inside the apparatus, thereby affecting the printing, scanning, or faxing operations.

SUMMARY OF THE INVENTION

Accordingly, it is an aspect of the present invention to provide a multifunctional apparatus that lowers electromagnetic interference (EMI) by reducing a length between circuit boards and decreasing a number of circuit boards.

Additional aspects and/or advantages of the invention will be set forth in part in the description which follows and, in part, will be obvious from the description, or may be learned by practice of the invention.

The foregoing and/or other aspects of the invention may be achieved by providing a multifunctional apparatus including: a first circuit board which is installed on the first surface of the main body, receives a current from an external power source and supplies the current; a second circuit board which is installed on the second surface of the main body and receives the supplied current from the first circuit board, including a controller to generate control signals to control the first circuit board and a scanning unit; and a third circuit board which is installed on the third surface of the main body, to receive the current supplied from the first circuit board and the control signals from the second circuit board, and to supply the received current or control signals to the scanning unit.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Figure 1:
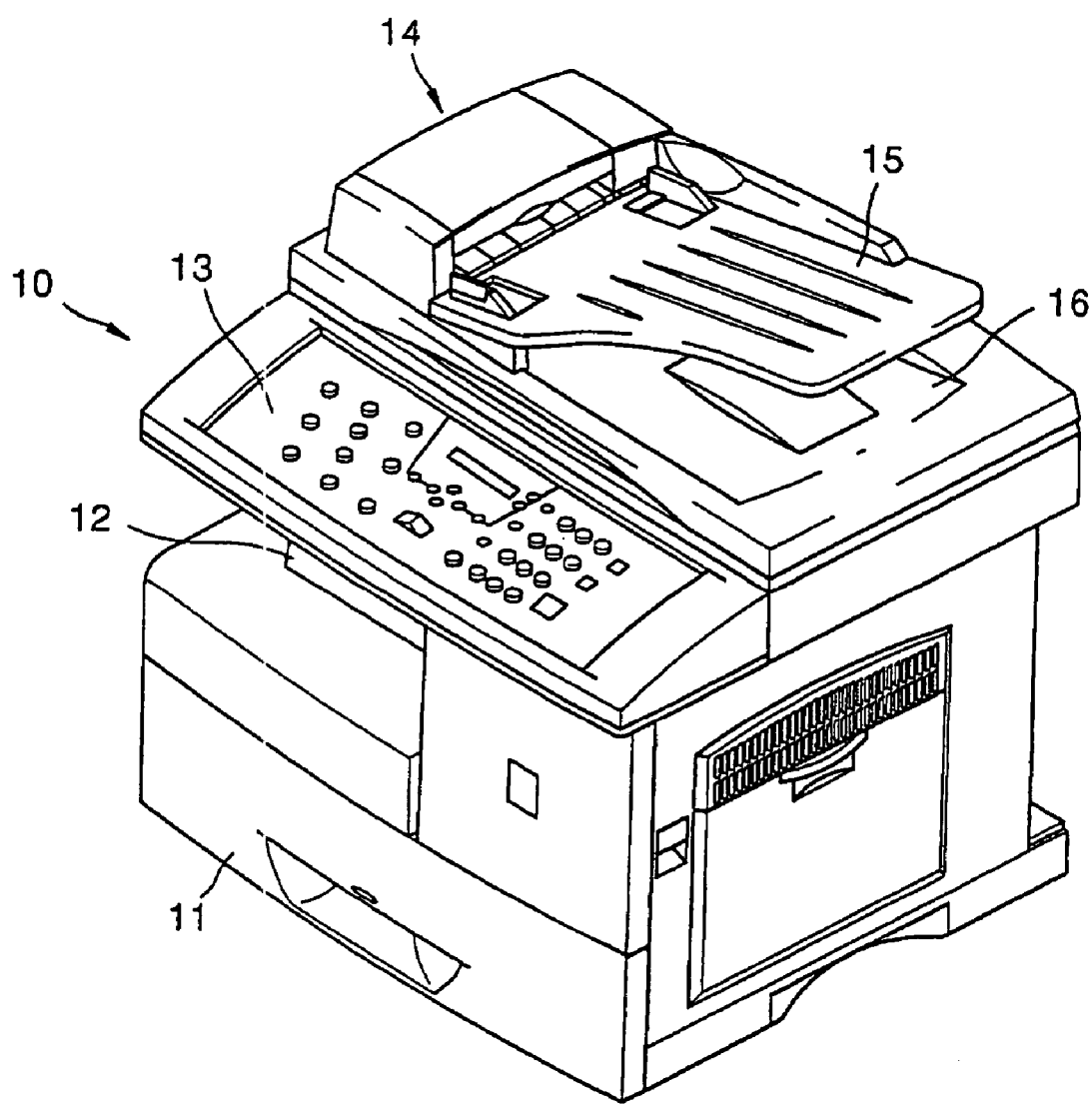
FIG. 1 is a perspective view of a conventional multifunctional apparatus.

Reference will now be made in detail to the embodiments of the present invention, examples of which are illustrated in the accompanying drawings, wherein like reference numerals refer to the like elements throughout. The embodiments are described below to explain the present invention by referring to the figures.

Figure 3:
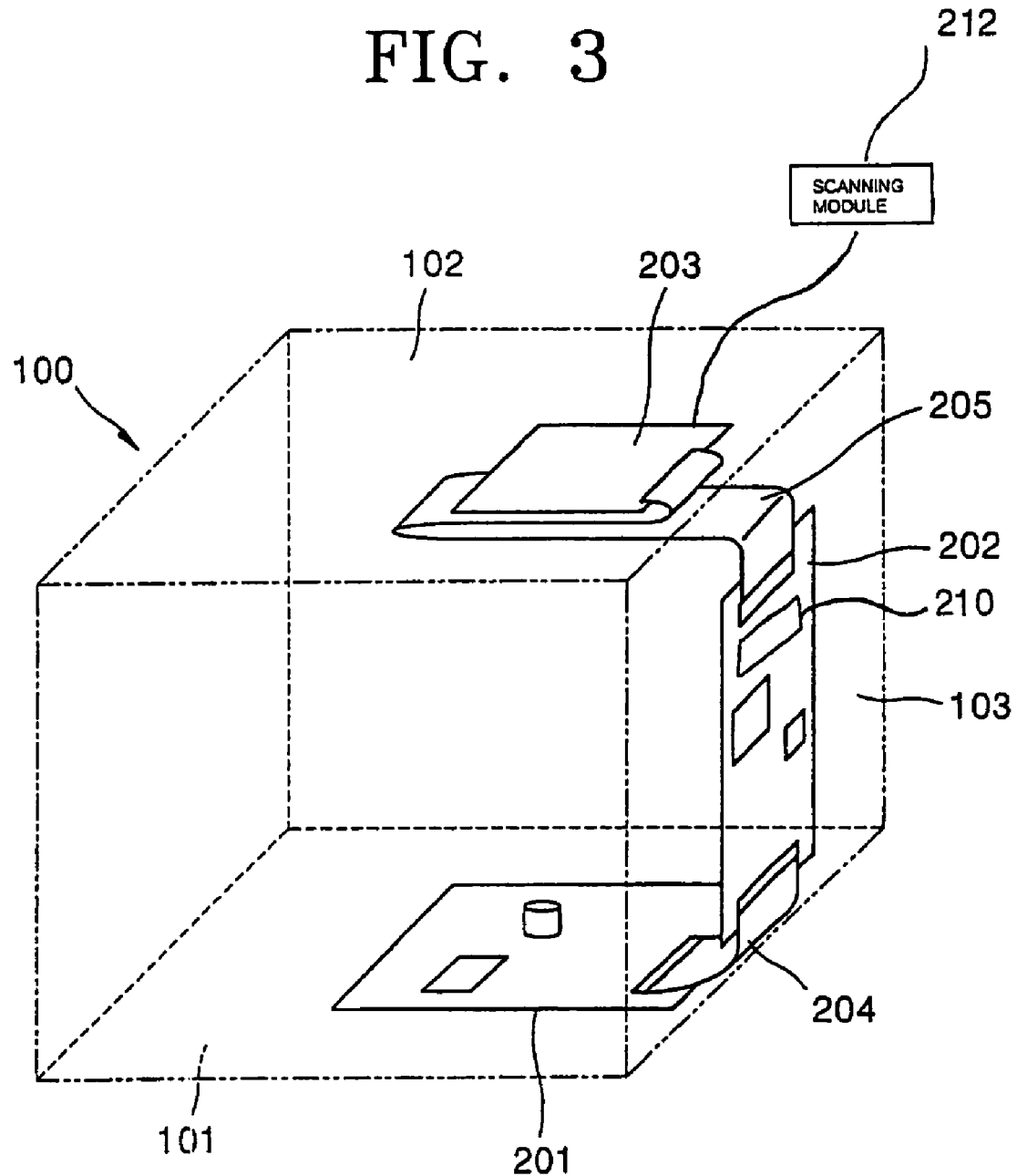
FIG. 3 is a perspective view of a layout of a circuit board in a multifunctional apparatus, according to an embodiment of the present invention.

FIG. 3 is a perspective view of a layout of a circuit board in a multifunctional apparatus, according to an embodiment of the present invention.

Referring to FIG. 3, a first circuit board 201, located in a lower surface 101 of a multifunctional apparatus 100, receives a current from an external power source and supplies the current to other circuit boards and devices in the multifunctional apparatus 100.

A second circuit board 202, which includes a controller 210 to control the other circuit boards and devices as a main board is installed on a surface 103 of the multifunctional apparatus 100, that is, the surface 103 which comes in contact with the lower surface 101.

Both ends of the second circuit board 202 are disposed perpendicular to upper and lower sides of the surface 103. That is, both ends of the second circuit board 202 having two short sides are placed near the upper and lower sides of the surface 103 which come in contact with an upper surface 102 and the lower surface 101. This may shorten a length of connecting units between the circuit boards and improve a characteristic related to electromagnetic interference (EMI).

A third circuit board 203, which supplies current or transfers control signals to a scanning module (212) as a scanning unit board, is installed on the upper surface 102 of the multifunctional apparatus 100.

Accordingly, the first circuit board 201 is disposed on the lower surface 101, the third circuit board 203 is disposed to face the first circuit board 201, and the second circuit board 202 is disposed perpendicular to the surface 103 between the first circuit board 201 and the third circuit board 203.

Figure 2:
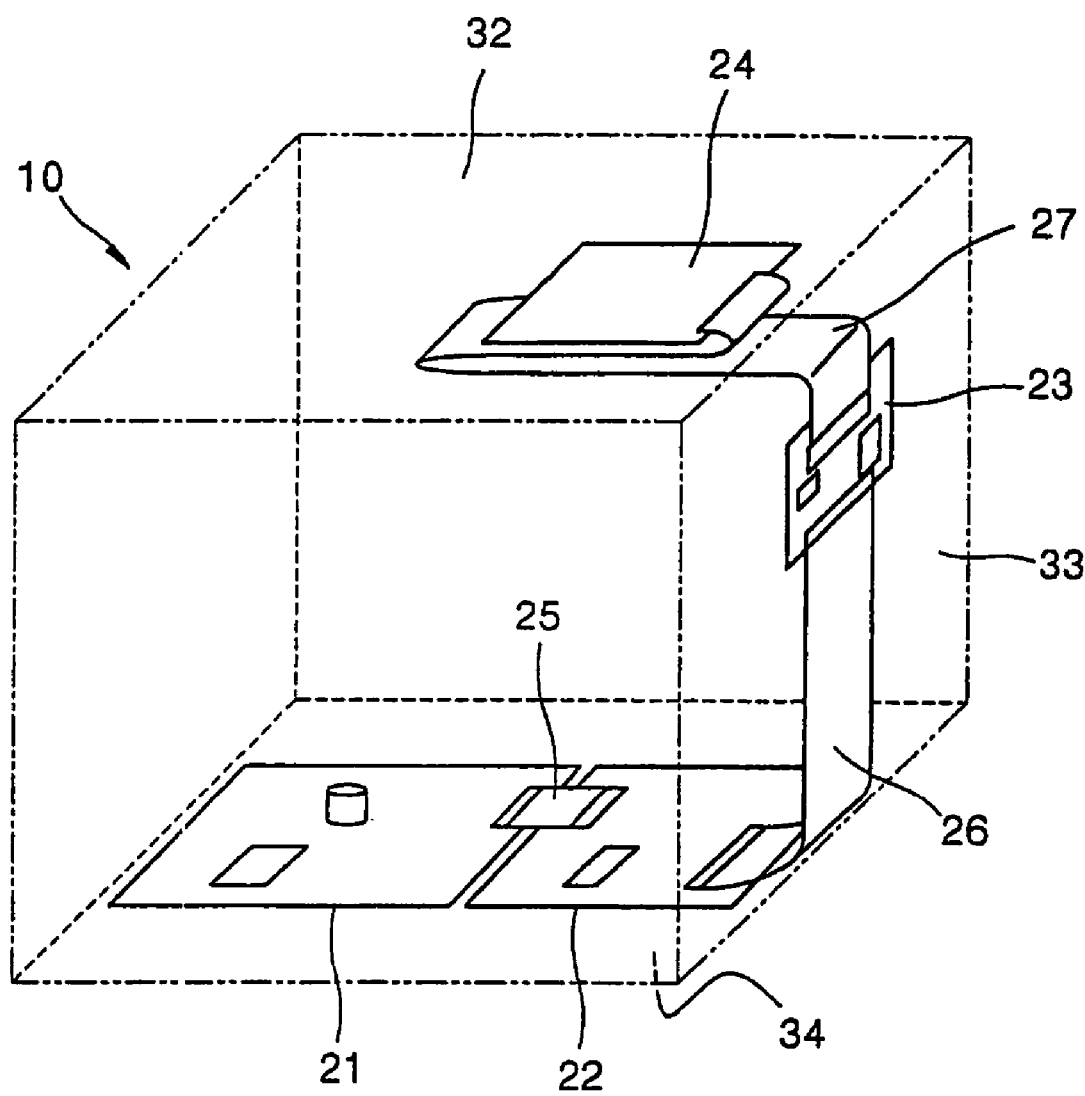
FIG. 2 is a perspective view of a layout of a circuit board in the multifunctional apparatus of FIG. 1.

Namely, the first, second, and third circuit boards 201, 202, and 203 are disposed in a "C" shape. The second circuit board 202 operates similar to the connecting board 23 of FIG. 2, and accordingly, a coupling unit such as the second connecting unit 26, which connects the connecting board 23 and the main board 22 in the conventional circuit board of FIG. 2, is not required in the embodiment of the present invention. The first, second, and third circuit boards 201, 202, and 203 are electrically connected to each other by connecting units. Specifically, the first and second circuit boards 201 and 202 are connected by a first connecting unit 204 and the second and third circuit boards 202 and 203 are connected by a second connecting unit 205.

The second circuit board 202 is disposed parallel with the surface 103, and thus, a total length of the connecting units is shortened by the height of the second circuit board 202. Therefore, the total length of the connecting units according the embodiment of the present invention is much shorter than that of the conventional circuit board of FIG. 2.

As described above, the multifunctional apparatus according the embodiment of the present invention lowers the EMI by using a circuit board disposed parallel with a surface of the multifunctional apparatus and shortening the total length of the connecting units between the circuit boards. Furthermore, the multifunctional apparatus according the embodiment of the present invention is inexpensive to manufacture since the connecting board is embedded in a circuit board.

Although an embodiment of the present invention has been shown and described, it would be appreciated by those skilled in the art that changes may be made in this embodiment without departing from the principles and spirit of the invention, the scope of which is defined in the claims and their equivalents.

What is claimed is:

1. A multifunctional apparatus comprising:
   a main body having first, second and third surfaces;
   a first circuit board which is installed on the first surface of the main body, receives a current from an external power source and supplies the current;
   a second circuit board which is installed on the second surface of the main body and receives the supplied current from the first circuit board, comprising a controller to generate control signals to control the first circuit boards and a scanning unit; and
   a third circuit board which is installed on the third surface of the main body, and receives the current supplied from the first circuit board directly from the second circuit board and the control signals from the second circuit board, and to supply the received current or control signals to the scanning unit,
   wherein the second circuit board has two sides respectively disposed perpendicularly to the first and third surfaces of the main body and is placed as close as possible to upper and lower sides of the second surface of the main body, and
   wherein the second circuit board is directly adjacent to the first and third circuit boards without intervening elements affecting the spacing between the second circuit board and the first and third circuit boards.

2. The apparatus of claim 1, wherein the first, second, and third circuit boards are disposed in a "C" shape.

3. The apparatus of claim 1, wherein the second circuit board is disposed parallel with the second surface of the main body.

4. The apparatus of claim 1, further comprising a plurality of connecting units to respectively electrically connect the first, second, and third circuit boards.

* * * * *